United States Patent
Tisue (10) Patent No.: US 6,636,536 B1
(45) Date of Patent: Oct. 21, 2003

(54) PASSIVE THERMAL COMPENSATION FOR WAVELENGTH AGILE LASER TUNERS

(76) Inventor: J. Gilbert Tisue, 1329 Santa Cruz Dr., Minden, NV (US) 89423

( * ) Notice: Subject to any disclaimer, the term of this patent is extended or adjusted under 35 U.S.C. 154(b) by 0 days.

(21) Appl. No.: 10/261,719

(22) Filed: Sep. 30, 2002

(51) Int. Cl.[7] .................................................. H01S 3/10
(52) U.S. Cl. .............................. 372/20; 372/34; 372/32; 372/33
(58) Field of Search .......................... 372/20, 32, 102, 372/34, 29.02, 33

(56) References Cited

U.S. PATENT DOCUMENTS

| | | | |
|---|---|---|---|
| 5,319,437 A | | 6/1994 | Van Aken |
| 5,450,202 A | * | 9/1995 | Tisue ......................... 356/614 |
| 5,546,220 A | * | 8/1996 | Endo et al. .................. 359/332 |
| 5,594,744 A | * | 1/1997 | Lefevre et al. ............... 372/20 |
| 6,339,609 B2 | * | 1/2002 | Lefevre ....................... 372/99 |
| 6,434,173 B1 | * | 8/2002 | Tuganov et al. ............... 372/9 |
| 6,493,365 B1 | * | 12/2002 | Wu et al. ...................... 372/20 |
| 2003/0007522 A1 | * | 1/2003 | Li et al. ....................... 372/20 |
| 2003/0012237 A1 | * | 1/2003 | Tuganov ...................... 372/34 |
| 2003/0012239 A1 | * | 1/2003 | Daiber et al. ............. 372/38.01 |
| 2003/0021303 A1 | * | 1/2003 | Daiber ........................ 372/20 |

* cited by examiner

Primary Examiner—Leon Scott, Jr.

(57) ABSTRACT

Passive thermal compensation for wavelength agile tuners provides high speed, accurate laser tuning over a wide range of wavelengths and temperatures. Thermal shims (104) and (106) closely coupled to agile tuning elements (100) perform wavelength offset corrections (73) in the rapidly changing thermal environment associated with high power pulse lasers. Sensor coupling mechanisms (114) compensate housing and tuning element for gain or band sensitivity thermal variations (62). Thermal injection from both wide temperature extreme ambient and tuned energy is accommodated. Improved thermal characteristics lead to a wider range of materials for higher performance and reduced metallurgical incompatibilities.

20 Claims, 7 Drawing Sheets

PASSIVE THERMAL COMPENSATION FOR WAVELENGTH AGILE LASER TUNERS

BACKGROUND OF INVENTION

1. Field of Invention

This invention relates to passive temperature compensation of rotatable gratings and other wavelength selecting devices used to tune lasers.

2. Prior Art

Laser radar (LIDAR) systems, utilizing tunable lasers, can be used to transmit different wavelengths of light into airborne suspensions (such as smog or poison gasses) which have differing reflectance's or absorption to different wavelengths. The reflected light intensity is then measured for remote spectrographic analysis of suspension samples. It is advantageous to maximize the stability and repeatability of the output at each different wavelength. It is also advantageous to minimize intervals between transmitting wavelengths in order to reduce measurement interference by relative motion between the LIDAR unit, the intervening atmosphere and the suspension sample. Maximum accuracy is achieved by successively transmitting different wavelengths with constant power at the laser's maximum cyclic rate.

Tunable lasers typically include an intra-cavity diffraction grating. The wavelength of such lasers is tuned by adjusting the angle of incidence of the laser cavity beam against the diffraction grating. Such intra-cavity tuning requires very high accuracy and stability. Tuned $CO_2$ lasers, for instance, require a grating angular range of typically 0.2 radians and an accuracy of 10 or 20 $\mu$radians. Output laser power is a sensitive function of the tuning angle near a particular wavelength. This accuracy can only be achieved through careful design of housings, optics, sensors, feedback loops, actuators and system configuration.

Figure 1:
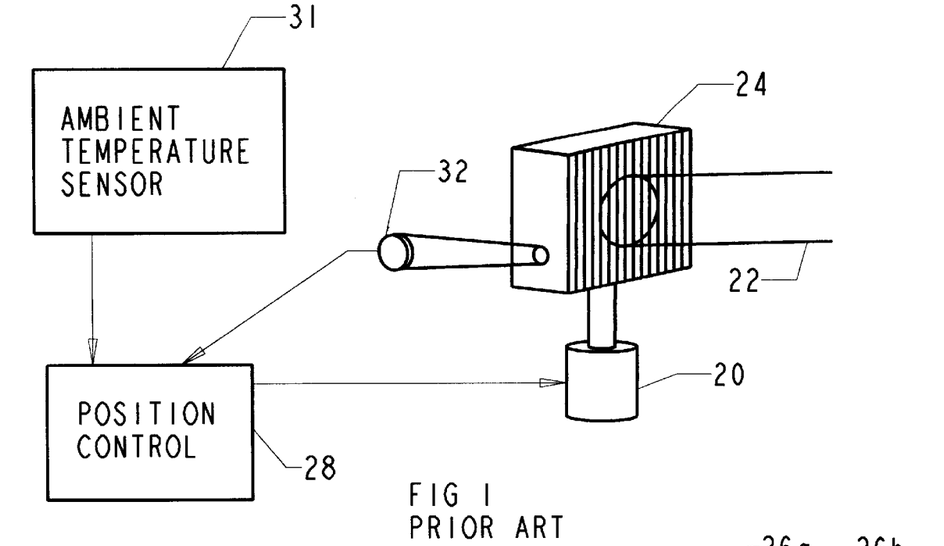
FIG. 1 is a rotary grating tuner in the prior art.

In FIG. 1 of the prior art, a representative directly driven grating implementation is shown. Intra-cavity beam 22 is tuned by rotary grating 24 responsively changing the Littrow reflection incidence angle relative to cavity 22, thereby selecting lasing wavelength. Actuator 20 in response to control by position control 28 rotates grating 24 to produce different wavelengths. Grating position is sensed by position sensor 32 and ambient temperature is sensed by sensor 31. Position control 28 includes position data for sequencing between desired positions and therefore wavelengths and provides output drive to actuator 20, responsive to said position data, actual position information from position sensor 32 and ambient temperature sensor 31.

Temperature induced variations, especially in the grating, position sensor, and sensor coupling pose a serious threat to the functionality of the tuner. These variations are the result of absorbed cavity as well as ambient energy. Military applications may require high cavity power and oppressively wide operating temperature ranges. Changes in temperature of the grating blank or base material, for instance, modify the apparent ruling of the grating and therefore its tuned frequency. The position sensor and its coupling have a direct effect on the tuned frequency of the cavity. Cavity detuning results in output power fluctuations.

Several techniques have been used to nullify the effects of these errors. Grating 24 can use a blank material of low coefficient of thermal expansion (CTE). Invar as a grating blank material, for instance, would have a CTE of typically 1.3 ppm/K. Special invar can reduce this somewhat further. Even this small CTE would generate an excessive error of 65 $\mu$radians for a 40° C. ambient rise and 10° C. cavity induced temperature rise.

Another technique for ambient correction is to use the temperature sensor 31 to crudely modify the desired position address data in position control 28 in a calibrated way to compensate for the thermal induced errors of the grating and sensor. Thermal errors generated by laser cavity energy are not compensated unless complex rotating or additional non-contact thermal sensors are used.

These techniques are inordinately complex and do not function well even for the relatively small errors generated by low CTE gratings. Most serious of the deficiencies are the nonlinear and unpredictable temperature variations of most sensors and the thermal time constant mismatch between the elements. Additionally, invar is a poor material to work with. Invar has high density, low thermal predictability and low thermal conductivity. It is difficult to machine and has dissimilar metals incompatibility with many optical surface materials. Its density and thermal conductivity discourage use at high power or rapid tuning rates. The use of lighter, more compatible blank materials with unavoidably higher CTEs function even more poorly.

Figure 2:
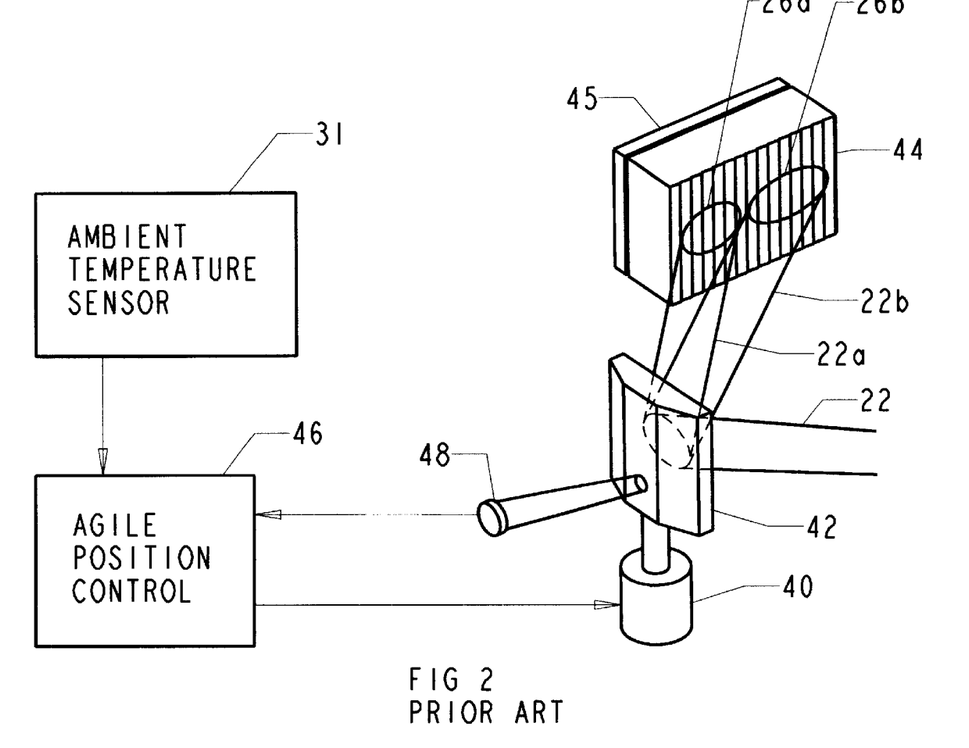
FIG. 2 is an agile tuner implementation in the prior art using a rotary mirror and optically coupled grating.

FIG. 2 of the prior art is based on an adaptive resonant positioner disclosed in U.S. Pat. No. 5,450,202. As disclosed, high accuracy and speed are combined as a result of the adjustment of adjacent pairs of drives on.a pattern delayed basis. Intra-cavity beam 22 is tuned by rotating agile mirror 42 which reflects beam 22 as beam 22a onto fixed grating 44 responsively determining the incidence angle between cavity 22a and grating 44 thereby selecting lasing wavelength. A second position of mirror 42 results in cavity beam 22b for another incidence angle and lasing wavelength. As shown, the cavity beams 22a and 22b intersect the grating at 26a and 26b for two of the tuned wavelengths in a tuning band. Mirror 42 is rotated by actuator 40 in response to control by agile position control 46. Mirror position is sensed by position sensor 48 and ambient temperature is sensed for calibrated correction by sensor 31. Agile position control 46 provides output drive to actuator 40 responsive to the internally defined desired position data, actual position information from position sensor 48 and ambient (temperature sensor 31.

This system operates better in a high tuning rate, thermally hostile environment for a number of reasons. Since the grating is fixed mounted, a massive and therefore thermally improved version including active thermal control 45 is possible. Alternately, even without thermal control 45, better thermal coupling reduces the thermal differences between ambient and grating temperature. More importantly, the mirror is no longer a thermally sensitive element and can be constructed of light material for high speed and compatibility with optical coatings. The position sensor is typically a linear Si sensor and is thus more predictable and stable than other types of sensors.

Although this approach enjoys speed and thermal advantages over the FIG. 1 prior art, it is still too complex, requires a larger grating for the same beam size, is susceptible to mismatched thermal time constants and falls short in performance for stringent military requirements. Wide operating temperature ranges still require the use of invar for grating blanks. Additionally, for high power tuners, the mirror damage threshold drops by one half since a reflection occurs twice as often for each cavity round trip.

SUMMARY OF INVENTION

Preferred embodiments of a passive thermal compensation for wavelength agile laser tuners according to the present invention include wavelength selection means, thermal shim means, sensor coupler means and tuner controller means. Thermal energy from lasing or environmental injection coupled into the wavelength selection means is tightly coupled to the thermal shim means. Temperature variations of the thermal shim means produce angular corrections to the operation of the wavelength selection means to produce corrected wavelength tuning at a typically narrow band of wavelengths and at a rate which closely tracks the error producing thermal expansion of the wavelength selector. Sensor coupler means receives thermal energy from environmental injection and modifies sensor tuning sensitivity to produce corrected tuning at a wider band of wavelengths.

LIDAR and other types of remote chemical sensors utilize the acute absorption of energy at specific wavelengths as compared with relatively low absorption at others. Unfortunately, laser return energy already includes unavoidable and confusing variations due to target and background motion, atmospheric scatter and sensor attitude changes. High repetition rates reduce some of the variations by tending to freeze the motion. It is important to maintain the transmitted energy as constant as possible in order that laser energy variations do not add to the return energy uncertainty. $CO_2$ laser systems are especially sensitive since tuning angle variations of only a few $\mu$radians can affect the lasing energy significantly. Techniques for rapidly and accurately tuning have been used successfully as described in U.S. Pat. No. 5,450,202 that utilizes a pseudo-resonant agile tuner controller.

Chemical sensors, especially in military applications, must operate in hostel environments. The effect of temperature on the tuning mechanisms is a particularly severe problem. The thermal energy comes from two primary sources; energy produced by the lasing process and ambient temperature. Temperature variations can easily exceed 50° K on the basic tuning element. For some applications, even gratings based on invar blank technology produce unacceptably large tuning errors. For increased speed, gratings need to be based on non-invar, lighter and more materials compatible blanks. Such blanks have 2 to 10 times higher tuning thermal errors. Higher power applications also prefer better thermal conductivity, non-invar materials to avoid excessive thermal drops.

Objects and Advantages

It is a primary objective of the present invention to provide a simple temperature stable positioner suitable for wavelength tuning of high power agile lasers used in extreme thermal environments.

It is another objective to eliminate thermal sensors and complex correction algorithms.

It is another objective to compensate for both ambient and laser generated temperature variations.

It is another objective to provide a more accurate wavelength tuner.

It is another objective to provide more rapid wavelength tuning.

It is another objective to provide a simpler tuner.

It is another objective to enable the use of a wider range of materials for optical elements in a wavelength tuner.

It is another objective to reduce the number of intra-cavity reflections.

It is another objective to enhance compensation techniques by improving thermal time constant matching between thermal variations and compensation.

It is another objective to temperature compensate an OPO wavelength tuner.

The foregoing and other object features and advantages will become more apparent from a reading of the following description of the preferred embodiments as shown in connection with the accompanying drawings.

DETAILED DESCRIPTION (A) Tuning Thermal Effects

Laser tuning requirements often require less than 20 $\mu$radian angular error over a range of 0.2 radians. This absolute repeatability of 0.01% must hold over 50 or more degrees Kelvin in many applications. In typical tuner applications, the wavelength selection element responds to thermal energy from the laser cavity plus that from the environment or ambient. Most of the remainder of the tuning system is tied to ambient only. A further complication is that the rate of change of temperature variations can range over several orders of magnitudes. The compensation change rate must match the corresponding error generation rate.

Grating Tuning Element

Figure 3A:
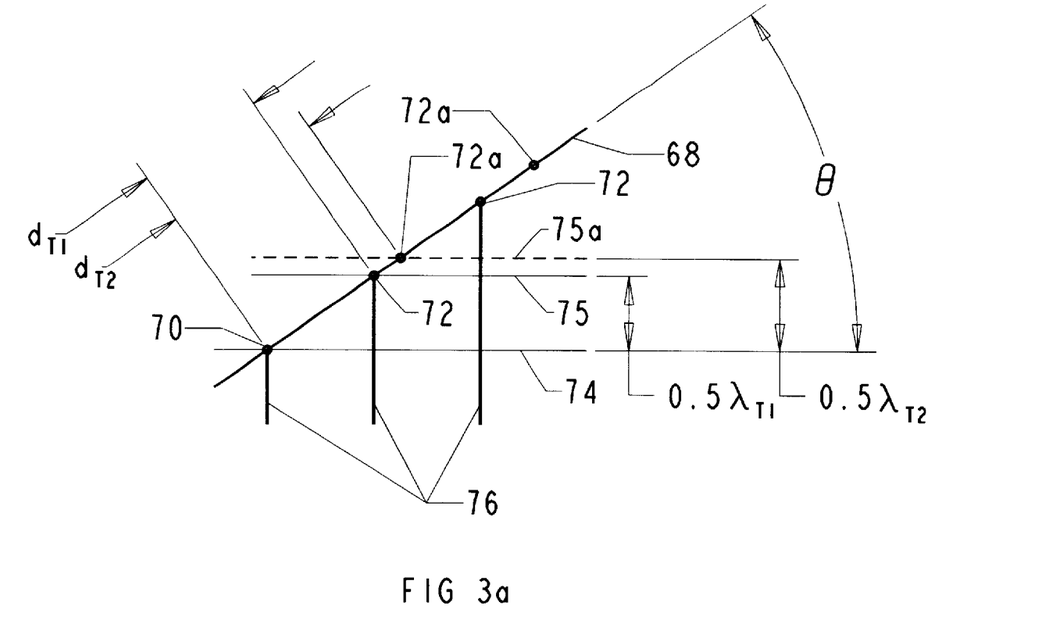
FIG. 3a is a diagram summarizing Littrow reflection including uncompensated temperature effect.

A serious thermal variation, in grating tuners, comes from the grating itself. The grating is constructed on a substrate material, typically Cu or invar with the ruling lines on a thin optical coating suitable for the particular lasing wavelength. Thermal expansion of the grating ruled lines is dominated by the CTE of the substrate. Therefore, the ruled lines expand and contract with temperature as a function of the CTE of the substrate material. FIG. 3a is a diagram representing an edge view of the grating ruled lines in Littrow reflection at two temperatures. Actual grating lines can be of any profile but are simplified in FIG. 3a and shown in edge view as single dots. Grating line 70 is a reference line for both temperatures. At a first temperature T1, grating lines 70 and 72 in the plane of the grating 68, reflect input beam energy along line 76 back in Littrow reflection as output beam energy also along line 76. At temperature T1 the grating lines are separated by a distance $d_{T1}$. The angle θ is the incidence angle between the input/output beams 76 and the grating plane 68. Input beam energy along lines 76 can be thought of as having a first wavefront 74 and a second wavefront 75 separated by ½ wavelength in the Littrow condition because the energy reflected from the grating line-on wavefront 75 will return in-phase with that reflected from the grating line on wavefront 74. Similarly, in-phase reflections occur for all wavefronts intersecting grating lines 72. From simple geometry, the relationship between the incidence angle θ, ruling spacing d and the wavelength λ is the well-known expression:

$$\lambda = 2d \sin \theta$$

As shown by FIG. 3a, at the temperature T1, grating line spacing $d_{T1}$ tunes a wavelength $\lambda_{T1}$. At a temperature T2, expanded grating elements 72a have a spacing $d_{T2}$ and tune a wavelength $\lambda_{T2}$ as a result of new wavefront 75a. Clearly, for the same incidence angle, the tuned wavelength is proportional to the grating line spacing and therefore also proportional to temperature. The tuning angle θ and the temperature are thus related by the non-linear sine function.

Figure 3B:
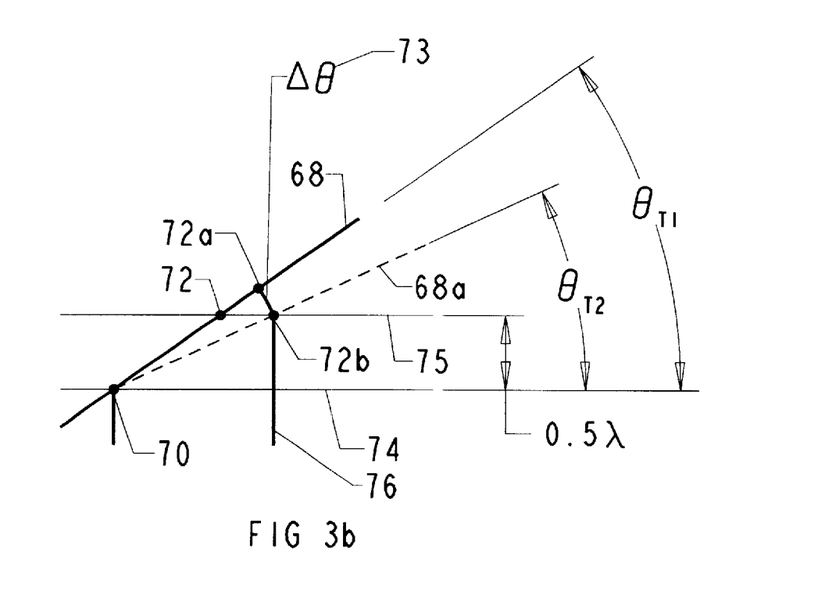
FIG. 3b is a diagram showing Littrow reflection including compensation at a wavelength.

FIG. 3b is a diagram showing the angular change necessary to compensate for the temperature shift. In the figure, 70 and 72 represent the grating lines, which produce a wavelength λ at an incidence angle $\theta_{T1}$, a temperature T1 and a grating plane 68. At temperature T2, grating lines 70 and 72 become 70 and 72a and an angular change of the grating plane to 68a would be necessary to maintain the tuned wavelength λ. As a correction, grating line 72a traverses an arc 73 to 72b. For constant CTE of the grating, CTEg, the tuning offset error or correction angle Δθ 73 required to hold tuned wavelength constant between two temperatures can be computed to be approximately:

$$\Delta\theta = CTEg(T2-T1)\tan(\theta)$$

Where θ is the incidence angle at the wavelength being computed, preferably near tuning band center. Because of the non-linearity between the incidence or tuning angle θ and temperature, this correction, Δθ, will vary across the tuning band. Accurate compensation would require at least a tuning offset or shift and a tuning gain or sensitivity correction. Offset correction alone would be valid for a narrower band of wavelengths.

Δθ, as described above, can be considered to represent the tuning error without compensation. An uncompensated Cu substrate and 50° K temperature variation produces an error of 750 μradians. An invar substrate at 1.3 ppm/K produces an error of 65 μradians. Both of these errors would be unacceptable for a laser tuner.

Optical parametric oscillators (OPO) and other devices used as tuning elements along with their mounts may also need corrective angular offsets as a function of temperature.

Sensor Coupling Structure

A second major source of thermal drift with temperature relates to the coupling of the position sensor. For high accuracy systems with even moderate temperature requirements, capacitive or RF sensors have had dismal results. Systems utilizing the techniques of U.S. Pat. No. 5,450,202, which use reference lasers, linear position sensors and pattern delayed feedback loops, have been effective over moderate temperature ranges. The charge-coupled device (CCD) typically performing the basic position sensing function gets stability and predictability from its multi-element construction. The CCD itself has a stable CTE of 2.5 ppm/K but, when used with the typical Al housing at 22 ppm/K, creates an angle variation that must be compensated.

Figure 3C:
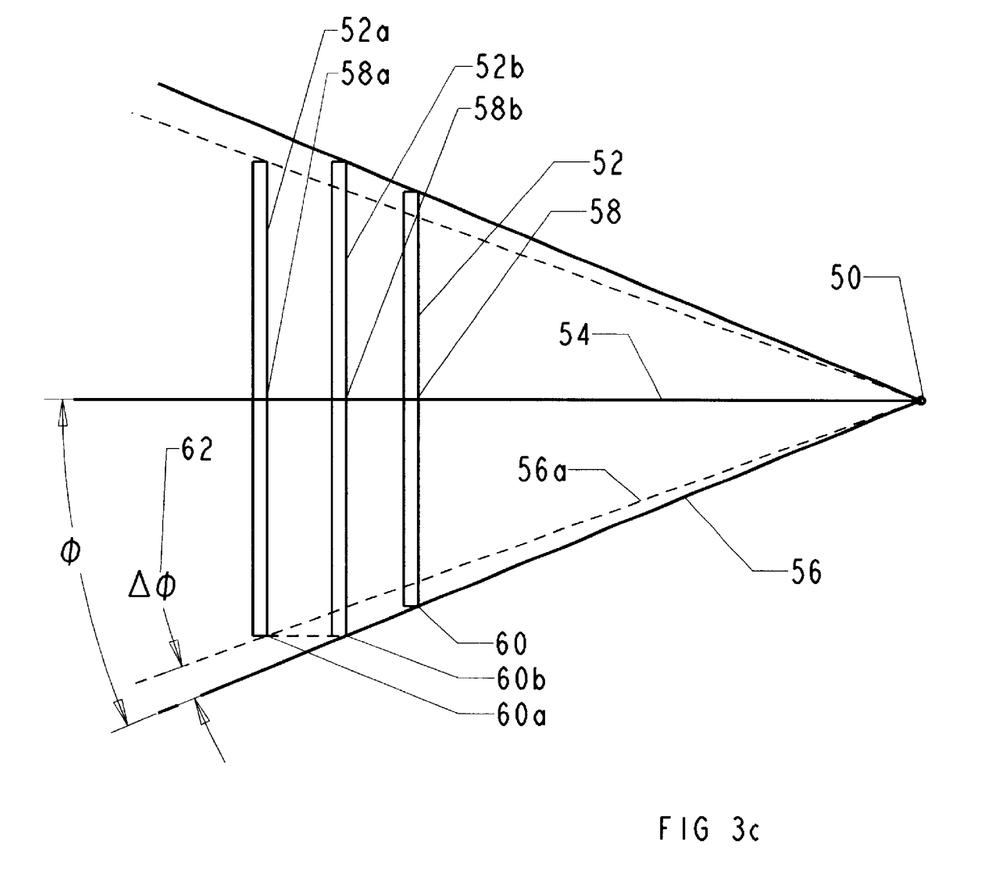
FIG. 3c is a diagram showing thermal gain or deflection sensitivity effect due to sensor coupling and a compensation methodology.

FIG. 3c is a diagram of this error and its compensation. The equivalent point of sensor deflection 50, typically a galvanometer mirror, produces an output beam on the CCD 52 at a given temperature. Two such beams are 54, centrally located in the tuning band or address space, and 56 near the edge of the address space. Operation of the normal feedback loops causes the mirror and therefore the wavelength selector to position the tuning at a desired address in the address space. As temperature is increased from a temperature T1 to temperature T2, the central beam distance from point 50 to point 58, expands at the CTE of the housing to the distance from point 50 to point 58a. At the same time, CCD 52 expands to that of 52a. That is, the distance from point 58 to point 60 expands at the CTE of the CCD to the distance from point 58a to point 60a. As the tuner operates in the central region, beam position 54, different rates of expansion between the housing and the CCD have little effect since the beam still continues to intersect the CCD correctly near its center. At temperature T2 and near the edge of the address space when the reference laser beam is in position 56, the mismatch in thermal expansion causes the angle for the correct address to be that of 56a. Under this condition, the point 60 at temperature T1 and point 60b at T2 produce the same angle and therefore require the same addresses. This corresponds to an uncompensated band edge error 62. The same type of error occurs at the opposite end of the CCD and therefore a tuning sensitivity or gain error is created. Matching the CTEs of the housing and CCD would cause the CCD to move to the position 52b at temperature T2 for significantly reduced error.

For CCD and sensor coupling CTEs of CTEccd and CTEsc respectively, the tuning error Δφ 62 between two temperatures, T1 and T2, at an angle φ from the angle where the offset compensation is valid, can be computed to be approximately:

$$\Delta\phi = (CTEsc - CTEccd)(T2-T1)\sin(2\phi)/2$$

Assuming a Si CCD, an Al housing, 40° K ambient temperature change and a φ of 10 degrees, an uncompensated error of 130 μradians results. Since this value is well above acceptable error levels, compensation is required. Solving this equation for CTEsc, the required sensor coupler CTE can be calculated for any desired correction angle Δφ 62. The sensor coupling structure is substantially isolated from laser cavity energy and therefore this correction is appropriately responsive primarily to ambient temperature.

Other Thermal Effects

Individual tuner configurations may have other secondary thermal effects requiring either offset, gain or combination compensations. Obviously the compensation mechanisms to correct the primary errors noted above can also reduce said secondary effects as well.

(B) System

Figure 4:
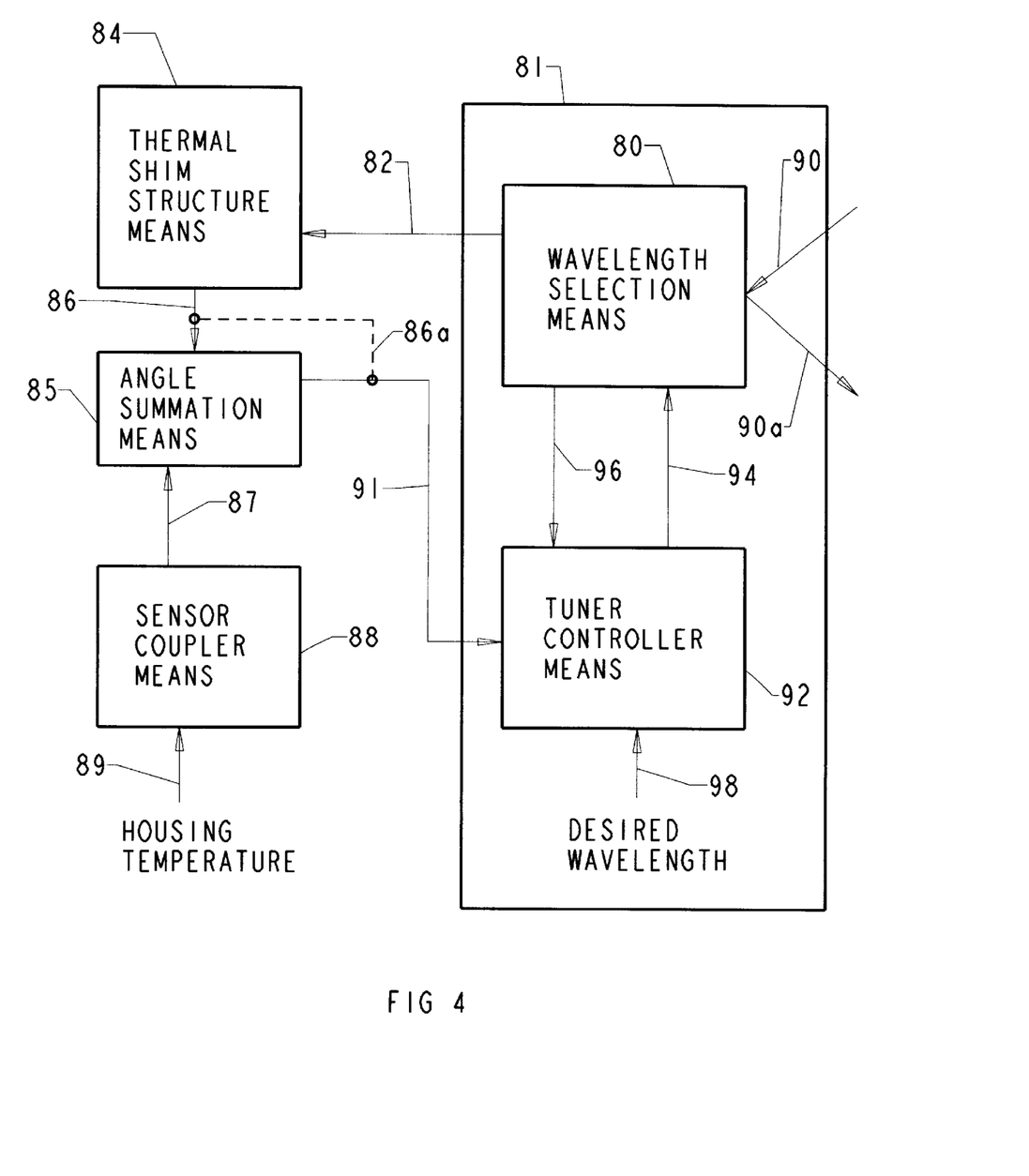
FIG. 4 is a block diagram of several embodiments of the present invention.

FIG. 4 is a block diagram representing a typical passive thermal compensation for agile tuners in accordance with present invention. As depicted, said invention preferably comprises input beam 90, output beam 90a, uncompensated tuner means 81, thermal shim means 84, angle summation means 85, sensor coupler means 88, and housing temperature input 89. Uncompensated tuner means 81 further comprises wavelength selection means 80, tuner controller means 92 and desired wavelength source 98.

Wavelength selection means 80 receives input beam angle 90 and outputs beam angle 90a responsive to tuning element drive 94 from tuner controller means 92. Wavelength selection means 80 additionally outputs wavelength selector temperature 82 to thermal shim means 84 and wavelength selector angle 96 to tuner controller means 92. Thermal shim means 84 receives wavelength selector temperature 82 and outputs offset compensation angle 86 to angle summation means 85. Sensor coupling means 88 receives housing temperature 89 and outputs gain compensation angle 87 to angle summation means 85. Angle summation means 85 receives offset compensation angle 86 from thermal shim means 84 and gain compensation angle 87 from sensor coupler means 88 and outputs wavelength selector compensation angle 91. Tuner controller means 92 receives wavelength selector angle 96 from wavelength selection means 80, wavelength selector compensation angle 91 from angle summation means 85, desired wavelength 98 and outputs tuning element drive 94 to wavelength selection means 80.

In operation, uncompensated tuner means 81 is substantially a tuner in the art, preferably an implementation of U.S. Pat. No. 5,450,202. Said tuner in the art does not include wavelength selector temperature output 82 nor is it responsive to wavelength selector compensation angle 91. In said tuner an input beam angle 90 is converted to an output beam angle 90a by wavelength selection means 80 also including an actuator and responsive to one or a plurality of desired wavelengths 98. As described, tuning errors related to the thermal characteristics of the tuning element and associated sensors degrade the performance with temperature.

Somewhat arbitrarily, said tuning errors can be broken down into angular offset and angular gain errors. Angular offset error can be corrected by injection of a constant angle at all tuning wavelengths. Angular gain error can be corrected by injection of an angle algebraically proportional to the difference between the tuning element angle and an angle where said offset error has been corrected. The present invention mechanically and thermally senses the tuning element and the tuner housing and generates mechanical compensation angles outside the feedback loops of the uncompensated tuner to correct the tuning process for ambient and tuned energy sourced temperature variation.

More particularly, input beam 90 is modified and converted to output beam 90a responsive to a wavelength selector angle established by tuning element drive 94 and wavelength selector temperature 82. Wavelength selection means 80 provides wavelength selector angle 96 to tuner controller means 92 and also wavelength selector temperature 82 to thermal shim means 84 in a tightly coupled manner. Thermal shim means 84, preferably and substantially at the same temperature as the wavelength selection means 80, passively generates an offset compensation angle 86 closely related to said wavelength selector temperature 82. Said offset compensated tuning angle 86, containing improved feedback information responsive to both laser cavity and ambient generated temperature variation, is applied to angle summation means 85. Sensor coupler means 88 is attached, via tight thermal coupling, to housing temperature 89 substantially representing ambient temperature. Sensor coupler means 88 responsive to the ambient temperature variation, supplies a gain compensation angle 87 to angle summation means 85. Angle summation means 85 receives the offset compensation angle 86 and the gain compensation angle 87 and supplies a summed wavelength selector compensation angle 91 to the tuner controller means 92. This summation process is a mechanical operation and occurs by nature of the tuner component mounting scheme. In some variant implementations, gain compensation may be unnecessary or undesirable. In said implementations, the offset compensation angle is applied directly to tuner controller means 92 via alternate mechanical connection 86a. Tuner controller means 92 typically includes a position sensor and address or wavelength sequence information 98 defining the positions or desired wavelengths to be visited by the tuner. Said controller means 92 provides tuning element drive 94 to the wavelength selection means 80 responsive to the wavelength selector angle 96, the wavelength selector compensation angle 91 and preferably learning information, lead-lag or other accuracy and speed enhancements enabling rapid and accurate positioning of the wavelength selector.

(C) Thermal Compensation for Rotary Grating Agile Tuner

Figure 5:
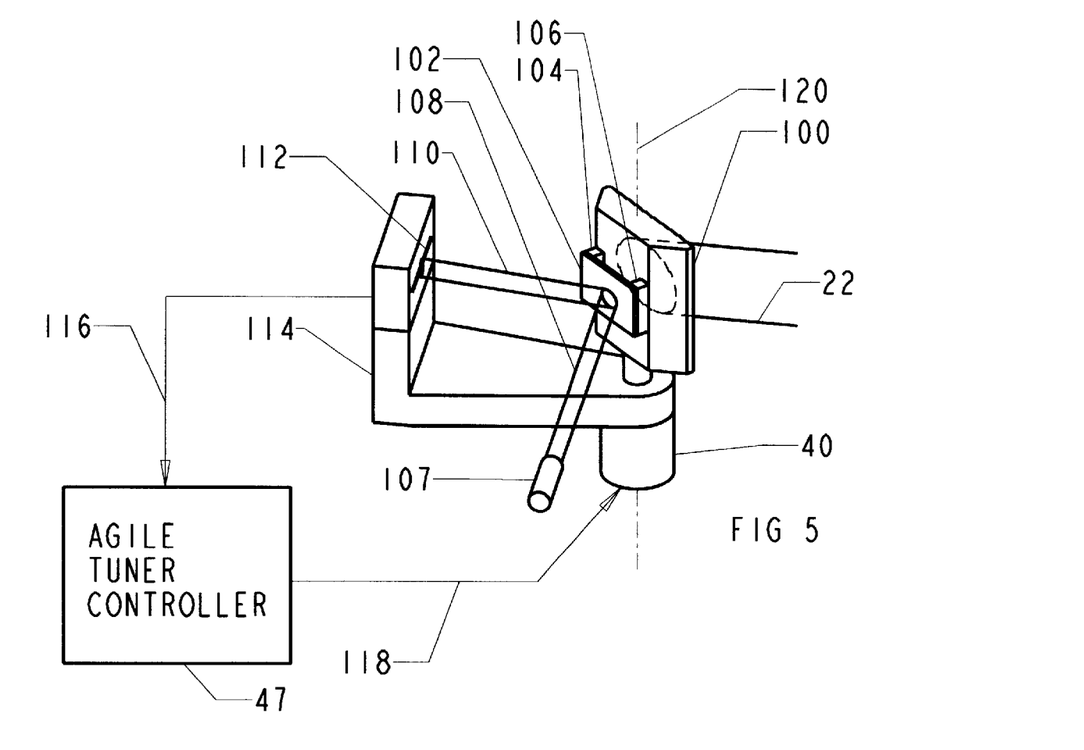
FIG. 5 is a diagram of a first preferred embodiment of the present invention utilizing a grating as the wavelength selective element whereby the grating is directly driven by the actuator.

FIG. 5 is a representation of thermal compensation for a rotary grating system according to the present invention in a first preferred embodiment. Thermal shims 104 and 106 comprise the thermal shim means 84 and sensor coupler 114 comprises the sensor coupler means 88 of FIG. 4. The remaining elements of FIG. 5 comprise the uncompensated tuner means 81 also of FIG. 4. Cavity beam 22 impinges agile grating 100 rigidly attached to actuator 40, preferably a galvanometer rotatable about actuator axis 120. Reference laser beam 108 from reference laser 107 is reflected off reference beam mirror 102 as position sampled beam 110 and onto sensor 112 typically a CCD. Reference beam mirror 102 is rigidly attached to agile grating 100 by thermal shims 104 and 106. Thermal shim 104 is typically of a different material and CTE than shim 106. Sensor 112 is referenced mechanically to the axis of actuator 40 and agile grating 100. Sensor 112 outputs thermally compensated position 116 to agile tuner controller 47. Agile tuner controller 47 outputs agile drive 118 to actuator 40.

In operation, cavity beam 22 impinges agile grating 100 in Littrow reflection forming one end of a Laser. Proper lasing at a particular wavelength is achieved only when a specific angle between agile grating 100 and a cavity axis occurs. Reference beam mirror 102 has a fixed and tightly coupled thermal and mechanical relationship with agile grating 100. Thermal energy absorbed by the grating raises grating temperature as well as the temperature of the thermally and mechanically attached shims 104 and 106. Reference laser 107 and its beam 108 impinge the reference beam mirror 102 sampling its position and reflecting as beam 110 onto sensor 112. Agile tuner controller 47 outputs the agile drive signal 118 responsive to the thermally compensated position output 116 from sensor 112 to accurately position the reference beam mirror 102 to desired position information not specifically indicated in FIG. 5. The feedback system described, except for specific thermal compensation, is generic in the art but is preferably that disclosed in U.S. Pat. No. 5,450,202.

Operation of Thermal Shim Structure

Feedback loop closure drives the operation of the tuner to set the reference beam mirror 102 to a prescribed address or angle. Any shift in the angle between reference beam mirror 102 and the agile grating front surface falls outside the closed loop behavior of the tuner and therefore provides the required shift with temperature. More particularly, the selection of the length and CTE of thermal shims 104 and 106 are used to provide the correction angle $\Delta\theta$ 73, the offset compensation in FIG. 3b.

Figure 6A:
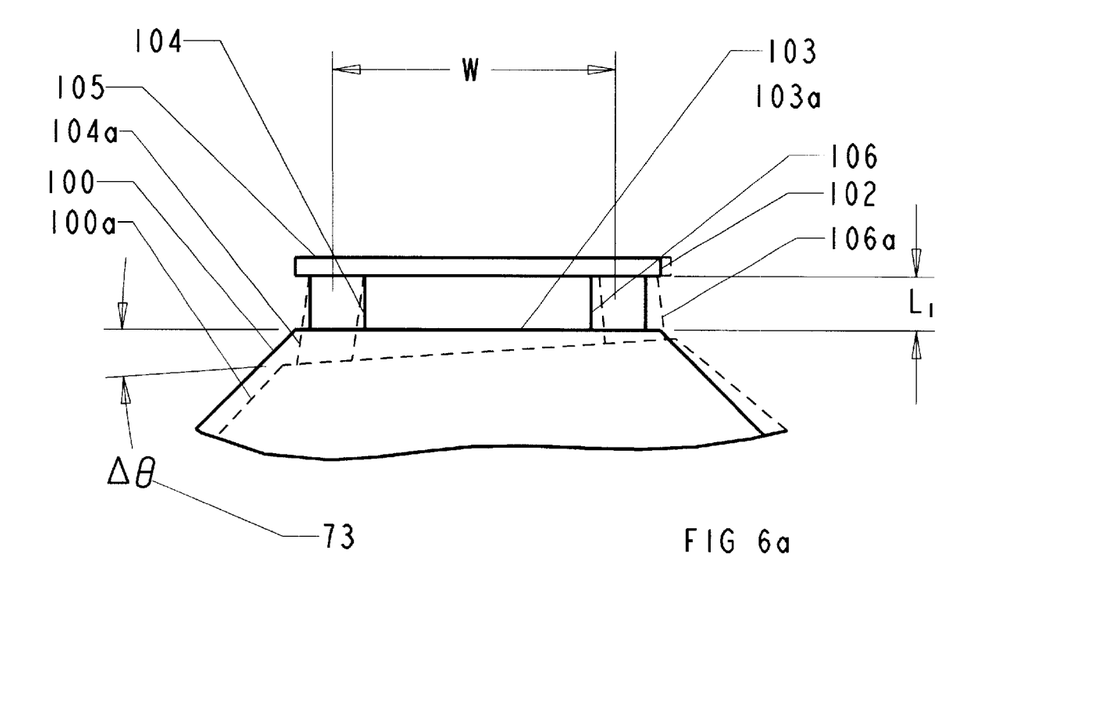
FIG. 6a is a diagram showing the operation of the thermal shim structure.

FIG. 6a is an edge view detail drawing of the thermal shim structure. In the figure, reference beam mirror 102 is shown with two thermal shims 104 and 106 spaced away from agile grating 100. Reference plane 105, as described, is held fixed by the normal non-compensated feedback loop closure of uncompensated tuner means 81. Thermal shim output plane 103 at the temperature T1 has a fixed angular relationship with the grating surface. Thermal shims 104 and 106 become 104a and 106a at temperature T2, a predictable and predetermined shift of Δθ 73, corresponding to a grating temperature change from T1 to T2. Since reference plane 105 is ideally not a function of temperature relative to tuner offset compensation, agile grating 100 will have been similarly rotated by angle Δθ 73. This thermal correction is valid for cavity generated as well as ambient temperature changes since it is set by sensing the grating temperature itself. A required shift of Δθ, based on shim spacing W, shim length $L_1$, thermal expansion coefficient $CTE_1$ for shim 104, $CTE_2$ for shim 106 and temperatures T1 and T2 can be computed approximately by:

$$\Delta\theta = L_1(CTE_1 - CTE_2)(T2-T1)/W$$

Typical materials for thermal shims include, for instance, Al for a high CTE at 22 ppm/K and invar for a low CTE at 1.3 ppm/K. Many other materials exist for a variety of correction requirements. Other versions of the thermal shim structure would be obvious to one skilled in the art and would fall within the scope of this invention. For instance, a single thermal shim 104 used without thermal shim 106, could perform the function as well.

It is anticipated that in some implementations, the contribution of tuner offset variation with temperature of the thermal shim structure would be set to a non-zero value to compensate for other systematic offset errors.

Operation of Sensor Coupler

Because the sensor coupler is not closely tied to cavity energy, compensation is substantially a correction for ambient or housing temperature variations. FIG. 3c and related description indicates the sensor coupler 114 methodology for tuning sensitivity or gain compensation. The material of sensor coupler 114 is selected, for CTE, to accomplish the thermal shift indicated in FIG. 3c. Sensor coupler 114 constrains the sensor spacing or the distance between the grating rotational axis 120 and position sensor 112.

Figure 6B:
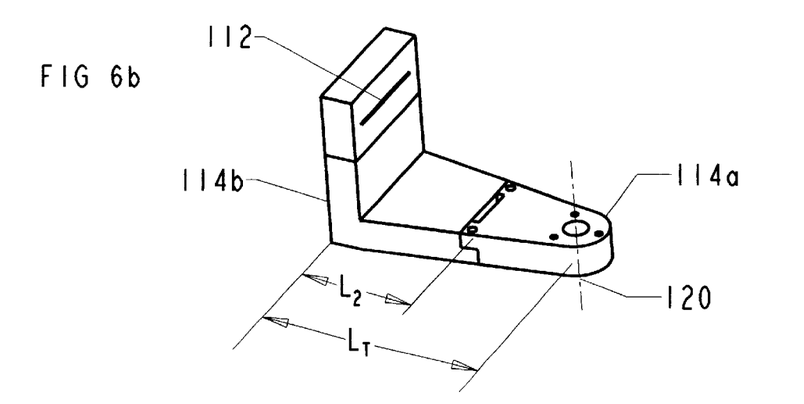
FIG. 6b is a diagram showing a variation of a sensor coupler means.

Even though a large variety of materials are available, many applications may not find a single material to satisfy this CTE requirement close enough. FIG. 6b is a detail drawing of a composite sensor coupler and position sensor. Selecting the material of coupler component 114a for $CTE_1$ and 114b for $CTE_2$ along with distances $L_2$ and $L_T$ can generate an equivalent composite CTEsc substantially at any value between the material CTEs based on the relationship:

$$L_2 = L_T(CTE_1 - CTEsc)/(CTE_1 - CTE_2)$$

Typical materials for the composite sensor coupler include, for instance, Al for a high CTE at 22 ppm/K and invar for a low CTE at 1.3 ppm/K. Many other materials exist for a variety of correction requirements. The achievement of a particular CTE for a composite sensor coupler is possible in a number of ways, which would fall within the scope of this invention. For example, three materials could be used or, materials could be in an unbalanced form or configured in a subtracting manner instead of addition as disclosed above.

Note that it may be desirable to set the contribution of tuner gain variation with temperature of the sensor coupler to other than zero. For example, agile grating offset compensation described in connection with FIG. 3b leaves a residual tuning gain variation because of the noted non-linearity. Said residual tuning gain due to ambient variations can be included in this correction.

A less preferred implementation of a sensor coupler can generate a combined compensation angle by including a thermal shim within the coupler to accomplish tuning offset compensation. Since such a combined or unbalanced sensor coupler is thermally attached to ambient temperature only, laser cavity thermal energy falls outside of the correction.

(D) Thermal Compensation for Rotary Mirror Agile Tuner

Figure 7:
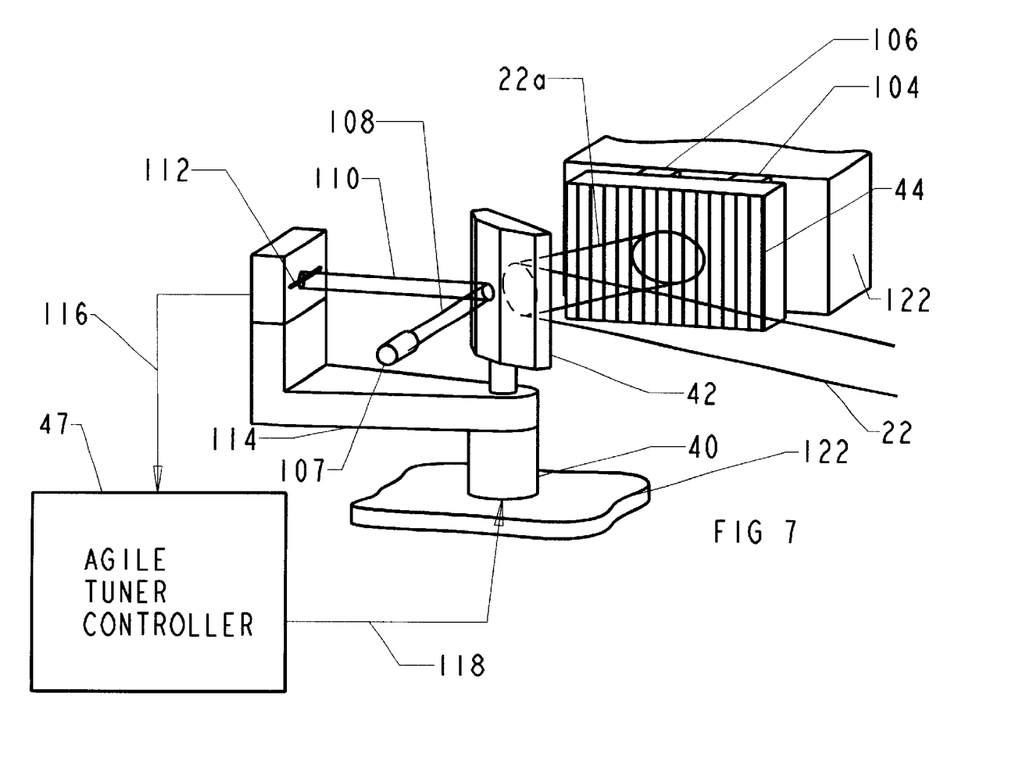
FIG. 7 is a diagram of a second preferred embodiment of the present invention utilizing a rotating mirror and fixed grating as the wavelength selective element.

FIG. 7 is a representation of thermal compensation for a rotary mirror and fixed grating system according to the present invention in a second preferred embodiment. Thermal shims 104 and 106 comprise the thermal shim means 84 and sensor coupler 114 comprises the sensor coupler means 88 of FIG. 4. The remaining elements of FIG. 7 comprise the uncompensated tuner means 81 also of FIG. 4. Cavity input beam 22 reflects off dual faced agile mirror 42 as beam 22a and impinges fixed grating 44. Agile mirror 42 is rigidly attached to actuator 40, preferably a galvanometer. Reference laser beam 108 is reflected off agile mirror 42 as position sampled beam 110 and onto sensor 112 typically a CCD. Fixed grating 44 is rigidly attached to housing 122 by thermal shims 104 and 106. Thermal shim 104 is typically of a different material and CTE than shim 106. Sensor 112 is referenced mechanically to the axis of actuator 40 and to housing 1 22. Sensor 112 outputs thermally compensated position 116 to agile tuner controller 47. Agile tuner controller 47 outputs agile drive 118 to actuator 40.

In operation, cavity input beam 22 and reflected beam 22a impinge fixed grating 44 in Littrow reflection forming one end of a Laser. Proper lasing at a particular wavelength is achieved only when a specific angle between fixed grating 44 and a cavity axis occurs. Thermal energy absorbed by the grating raises its temperature as well as the temperature of the thermally and mechanically attached shims 104 and 106. Reference laser 107 and its beam 108 impinge the agile mirror 42 sampling its position and reflecting as beam 110 onto sensor 112. Agile tuner controller 47 outputs the agile drive signal 118 responsive to the position output 116 from sensor 112 to accurately position the agile mirror 42 to desired position information not specifically indicated in FIG. 7. The feedback system described, except for specific thermal compensation, is generic in the art but is preferably that disclosed in U.S. Pat. No. 5,450,202.

Operation of Thermal Shim Structure

Feedback loop closure drives the operation of the tuner to set the agile mirror 42 to a prescribed address and angle. Angular shifts between fixed grating 44 and housing 122 fall outside the closed loop behavior of the tuner and therefore can provide the required shift with temperature to compensate for the grating tuning offset error. More particularly, the selection of the length, spacing and CTE of thermal shims 104 and 106 are used to provide correction angle Δθ 73, the offset compensation in FIG. 3b.

The operation of the thermal shims in FIG. 7 is the same as that described with reference to FIG. 6a in the first embodiment except that in the current embodiment, the thermal shim structure interfaces between the fixed grating 44 and housing 122 instead of the agile grating 100 and reference beam mirror 102. This thermal correction is valid for cavity generated as well as ambient temperature changes since it is set by sensing the grating temperature itself.

Operation of Sensor Coupler

Operation and application of the sensor coupler is identical to that described in connection with FIG. 5 of the first embodiment and FIG. 6b concerning the composite sensor coupler.

(E) Thermal Compensation for an OPO Agile Tuner

Figure 8:
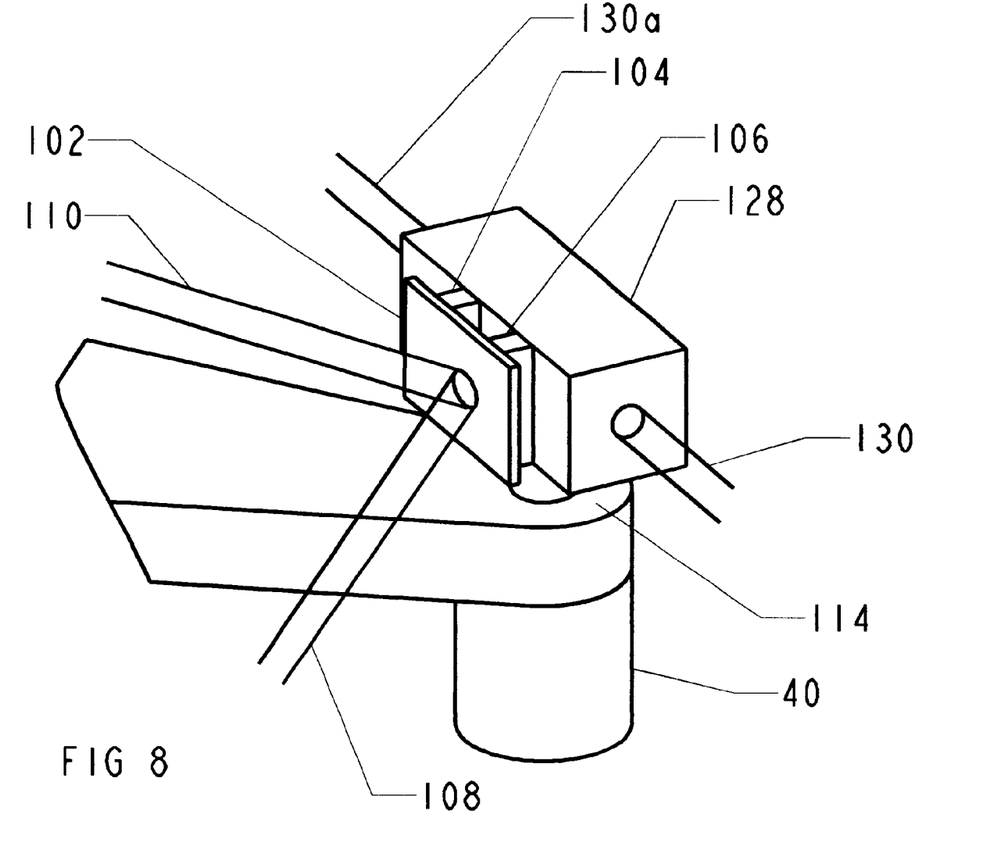
FIG. 8 is a diagram of a third preferred embodiment of the present invention utilizing an OPO as the wavelength selective element.

FIG. 8 depicts thermal compensation for an OPO crystal system according to the present invention in a third embodiment. This embodiment is a variation of the first preferred embodiment whereby agile grating 100 is replaced by OPO crystal 128 and cavity beam 22 is replaced by OPO input and output beams 130 and 130*a*. Operation of the thermal shim structure and the sensor coupler are identical although the need for the tuner offset compensation is less severe.

Conclusion, Ramifications and Scope of the Invention

As has been disclosed, this invention enables the operation of agile laser tuners at higher powers and over wider operating temperature ranges. It improves operating speeds and performance, at lower cost, by making tuner designs less dependent on denser, expensive and incompatible materials.

It is understood that the invention is not confined to the particular embodiments set forth herein as illustrated, but embraces such modified forms thereof as come within the scope of the following claims as would be obvious to those skilled in the art to which the present invention pertains. Mechanical and optical configurations have been shown in simplified form to present ideas, but folded optics, curved gratings and other mechanical alternatives would similarly fall within the scope of this invention. Simplified equations have been disclosed for compensation techniques, but compensation based on simulations, improved equations or finite element analysis techniques would fall within the scope of this invention. Functions, for ease of description, may fall into the domains of analog, digital, optical, thermal or mechanical but this disclosure is not limited to said description.

Although a number of embodiments have been described, other and in some cases less desirable variations would fall within the spirit and intent of this disclosure.

(1) The wavelength determining element could be a non-Littrow laser configuration.
(2) For ambient compensation only, and ignoring the cavity power, the thermal shim structure could be applied to the pointing angle of the reference laser 107.
(3) A thermal shim could be used to translate the position sensor itself for offset compensation.
(4) A temperature sensor and tuning address change could replace one or the other of the thermal shim means 84 or sensor coupling means 88.

Accordingly, the scope of the invention should be determined not by the embodiments illustrated, but by the appended claims and their legal equivalents.

I claim:

1. A thermal compensated wavelength tuner comprising:
a wavelength selector means, having a wavelength selector angle about a wavelength selector axis, for receiving an input beam at an input beam angle and producing an output beam at an output beam angle and including a wavelength selector axially coupled to an actuator responsive to an actuator control;
a thermal shim means for modifying an angular position of a sensing surface of the wavelength selector by a temperature dependent offset compensation angle;
a sensor coupler means for modifying a sensor spacing between a sensor and the wavelength selector axis, and for providing thermal coupling between said sensor coupler and said sensor and for providing a temperature dependent gain compensation angle, said coupler means including at least one or more coupler materials having different thermal expansion coefficients such that said wavelength selector angle is corrected by an angle sum;
a tuner controller means for sensing the modified wavelength selector angle sum such that the actuator control positions the wavelength selector at a predetermined wavelength of a substantially temperature invariant band of thermally compensated wavelengths.

2. The thermal compensated wavelength tuner as recited in claim 1 wherein said input beam angle is substantially equal to the output beam angle.

3. The thermal compensated wavelength tuner as recited in claim 2 wherein said wavelength selector means includes a rotary grating.

4. The thermal compensated wavelength tuner as recited in claim 2 wherein said wavelength selector means includes a rotary mirror and an optically coupled grating.

5. The thermal compensated wavelength tuner as recited in claim 2 wherein said sensor coupler means is a composite sensor coupler including multiple materials of differing thermal expansion coefficients predetermined in lengths to modify the sensor spacing.

6. The thermal compensated wavelength tuner as recited in claim 2 wherein said tuner controller means is a pseudo-resonant agile tuner controller.

7. The thermal compensated wavelength tuner as recited in claim 2 wherein said band of thermally compensated wavelengths is largely at a center of a band of desired tuned wavelengths whereby tuning temperature invariance is enhanced over a central region of said band of desired tuned wavelengths.

8. The thermal compensated wavelength tuner as recited in claim 2 wherein said wavelength tuner comprises a laser tuner.

9. The thermal compensated wavelength tuner as recited in claim 1 further including a sensor thermal shim means for translating the sensor whereby offset correction for ambient temperature variation is obtained.

10. The thermal compensated wavelength tuner as recited in claim 1 wherein said tuner means comprises an optical parametric oscillator tuner.

11. The thermal compensated wavelength tuner as recited in claim 1 wherein said sensor coupler means includes a coupler thermal shim structure operative to compensate a coupler tuning band offset for ambient temperature variations.

12. The thermal compensated wavelength tuner as recited in claim 11 wherein said thermal shim structure is coupled to a reference laser of said sensor.

13. The thermal compensated wavelength tuner as recited in claim 1 wherein said gain compensation angle compensates for other gain errors than that generated by the sensor and the coupler.

14. A thermal compensated wavelength tuner comprising:
a wavelength selector means, having a wavelength selector angle about a wavelength selector axis, for receiving an input beam at an input beam angle and producing an output beam at an output beam angle and including a wavelength selector axially coupled to an actuator and responsive to an actuator control;
a thermal shim means for modifying an angular position of a sensing surface of the wavelength selector by a temperature dependent offset compensation angle;
a tuner controller means for sensing the modified angular position of the wavelength selector, such that the actuator control positions the wavelength selector at a predetermined wavelength of a substantially temperature invariant band of thermally compensated wavelengths.

15. The thermal compensated wavelength tuner as recited in claim 14 additionally including:

a sensor coupler means for modifying a sensor spacing between a sensor and the wavelength selector axis, and for providing thermal coupling between said sensor coupler and said sensor and for providing a temperature dependent gain compensation angle, said coupler means including at least one or more coupler materials having different thermal expansion coefficients such that said wavelength selector angle is further modified by said gain compensation angle.

16. The thermal compensated wavelength tuner as recited in claim 15 wherein said wavelength selector means includes a rotary grating.

17. The thermal compensated wavelength tuner as recited in claim 15 wherein said wavelength tuner comprises a laser tuner.

18. The thermal compensated wavelength tuner as recited in claim 14 wherein said tuner controller means is a pseudo-resonant agile tuner controller.

19. A method of thermally compensating a wavelength tuner to cause said wavelength tuner to accurately select wavelengths under conditions of ambient and tuned energy induced temperature variations comprising the steps of:

providing a wavelength selector at a wavelength selector angle coupled to an actuator responsive to an actuator drive;

providing an input beam of optical energy at a wavelength along an input beam angle;

translating the input beam into an output beam at an output beam angle;

supplying a wavelength selector temperature to a thermal shim structure and responsively generating a temperature dependent offset compensation angle;

thermally coupling a sensor to a sensor coupler and responsively generating a temperature dependent gain compensation angle;

combining the offset compensation angle and the gain compensation angle as an angle sum;

sensing the wavelength selector angle as modified by said angle sum;

computing the actuator drive responsive to said angle sum;

applying said actuator drive to said actuator responsively positioning the wavelength selector to produce a substantially temperature invariant band of thermally compensated wavelengths.

20. The method of thermally compensating a wavelength tuner as recited in claim 19 wherein said step of thermally coupling a sensor to a sensor coupler further comprises the step of:

supplying an ambient temperature to an ambient thermal shim structure and generating an ambient offset compensation angle;

and wherein said step of combining the offset compensation further includes the step of:

including said ambient offset compensation angle in said angle sum.

* * * * *